United States Patent

Aronowitz et al.

[11] Patent Number: 5,963,801
[45] Date of Patent: Oct. 5, 1999

[54] METHOD OF FORMING RETROGRADE WELL STRUCTURES AND PUNCH-THROUGH BARRIERS USING LOW ENERGY IMPLANTS

[75] Inventors: Sheldon Aronowitz, San Jose; Laique Khan, Milpitas; James Kimball, San Jose, all of Calif.

[73] Assignee: LSI Logic Corporation, Milpitas, Calif.

[21] Appl. No.: 08/770,109

[22] Filed: Dec. 19, 1996

[51] Int. Cl.[6] .............................................. H01L 21/8238
[52] U.S. Cl. .......................... 438/217; 438/174; 438/194; 438/199; 438/232; 438/289; 438/291
[58] Field of Search .................... 438/174, 194, 438/289, 291, 199, 232, 217, FOR 205, FOR 216, FOR 217, FOR 218

[56] References Cited

U.S. PATENT DOCUMENTS

| | | | |
|---|---|---|---|
| 3,925,107 | 12/1975 | Gdula et al. | 148/1.5 |
| 5,384,279 | 1/1995 | Stolmeijer et al. | 438/217 |
| 5,399,895 | 3/1995 | Koga | 438/217 |
| 5,404,042 | 4/1995 | Okumura et al. | 257/371 |
| 5,405,790 | 4/1995 | Rahim et al. | 437/34 |
| 5,416,038 | 5/1995 | Hsue et al. | 438/217 |
| 5,492,845 | 2/1996 | Fujimaki | 437/40 |
| 5,693,505 | 12/1997 | Kobayashi | 438/289 |
| 5,693,976 | 12/1997 | Chao | 257/412 |
| 5,747,368 | 5/1998 | Yang et al. | 438/217 |
| 5,795,803 | 8/1998 | Takamura et al. | 438/199 |

Primary Examiner—Peter Toby Brown
Assistant Examiner—Long Pham

[57] ABSTRACT

A retrograde well in a CMOS device is formed by using a low energy ion implanter. Dopant atoms are implanted into a bare surface of the device's substrate, in a direction that is orthogonal to the surface of the substrate (for a substrate having a <100> orientation). The well implant can be performed at an energy below 220 keV. Chained implants for a punch-through barrier in the retrograde well can be performed after the well implant. When the substrate is annealed, the punch-through barrier is activated at the same time as the retrograde well.

14 Claims, 5 Drawing Sheets

METHOD OF FORMING RETROGRADE WELL STRUCTURES AND PUNCH-THROUGH BARRIERS USING LOW ENERGY IMPLANTS

BACKGROUND OF THE INVENTION

The invention relates to semiconductor fabrication. More specifically, the invention relates to the fabrication of retrograde well structures in CMOS devices.

Complementary Metal Oxide Semiconductor (CMOS) technology involves the pairing of complementary n-channel and p-channel MOS transistors to form low power integrated circuits. Each pair of complementary transistors is formed in close proximity on a substrate, with the p-channel transistor being formed in a heavily n-doped region of the substrate, and the n-channel transistor being formed in a heavily p-doped region. Low power consumption has made CMOS the technology of choice for very large scale integrated circuits, such as microprocessors, dynamic random access memories (DRAMS) and erasable programmable read only memories (EPROMS).

A major problem with CMOS devices is known as "latch-up." With the p-channel and n-channel transistors being in close proximity, conditions can arise that allow large currents to flow between the drain of one transistor and the source of the complementary transistor. The large currents, in turn, cause high power dissipation, which can stop the CMOS device from functioning or even destroy the CMOS device.

Latch-up can arise from voltage overshoot or undershoot at the terminals of the CMOS device, avalanche breakdown at the well-substrate junction, or device degradation that causes current to be shunted through the device. Avalanche breakdown can result from high voltages at the terminals, ionizing radiation, external voltage transients, or large charge buildups at the substrate-well interface. Device degradation could be caused by punch-through between the substrate region and the source/drain region of the device in the well, or avalanche ionization near the drain due to hot-electron effects.

Latch-up in a CMOS device can be prevented by the use of a retrograde well structure. Unlike a conventional well, which is formed by implanting and diffusing a dopant to a desired depth, a retrograde well structure is formed by performing deep implants to place the dopant at its desired depths without further diffusion. Resulting is a deep peak concentration below the surface and a negative slope approaching the surface (that is, a decreasing concentration towards the surface). The high concentration of dopants implanted near the well bottom shunts the carriers and prevents latch-up from occurring.

The deep implants for the n-wells are made by high energy implanters. U.S. Pat. No. 5,404,042 suggests an implant energy of 1.5 MeV for the deep implants. Although less energy can be used, the implanter still must be capable of performing implants at energies between 300 keV and 700 keV. Such implanters are commercially available, but they are very expensive.

Low energy implanters, which perform implants at energies of 220 keV and less, are also commercially available. They are also far less expensive than high energy implanters. If they could perform the deep implants, their usage would lower the cost of fabricating CMOS devices having retrograde well structures. However, using known techniques, the low energy implanters do not have sufficient energy to implant the dopants at the required depths in the substrate. Consequently, only high energy implanters are used at the present time for forming the retrograde well structures.

It is an objective of the invention to form retrograde well structures using low energy implanters.

SUMMARY OF THE INVENTION

This objective is achieved by methods according to the present invention. A method of performing a deep implant into a substrate of an MOS device comprises the steps of cleaning oxide and other material from a surface of the substrate, the surface being cleaned at a location where the implant will be made; and implanting a dopant directly into the cleaned surface of the substrate. The dopant is implanted at a low energy in a direction that is substantially co-aligned with lattice channels in the substrate. After the dopant is implanted, the substrate is annealed. The deep implant can be performed by a low energy implanter.

A method of fabricating a CMOS device having a pair of n-channel and p-channel transistors comprises the steps of forming isolation islands in the substrate; and doping a first region for the p-channel transistor. The first region is doped by cleaning a surface of oxides and other material at a location where the p-channel transistor will be formed, and implanting an n-type dopant directly into the cleaned surface of the substrate at a low energy in a direction that is substantially co-aligned with channels in the substrate. The method further comprises the steps of doping a second region for the n-channel transistor by performing a blanket implant of a p-type dopant; annealing the substrate; forming gate structures over the first and second regions; forming drain and source regions in the first and second regions; and forming contacts for the source and drain regions.

A method of fabricating a plurality of CMOS devices on a semiconductor wafer having a <100> orientation comprises the steps of forming isolation islands in the wafer; forming an n-well mask on a surface of the wafer, the surface being exposed through the mask at locations where n-wells are to be formed; cleaning the exposed surface of oxide and other material; and directing an n-type dopant towards the wafer at an energy between 150 keV and 220 keV in a direction that is orthogonal to the surface of the wafer. The n-type dopant is implanted deeply below the surface of the wafer. The method further comprises the steps of stripping the n-well mask; performing a blanket implant of a p-type dopant; annealing the wafer; forming gate structures on the wafer; forming drain and source regions in the wafer; and forming contacts for the source and drain regions.

An MOS device comprises a substrate having a plurality of channels in its lattice structure; and a retrograde n-well formed in the substrate. The retrograde n-well includes deeply-implanted concentrations of n-type dopant occupying the channels of the substrate and n-type dopant occupying lattice positions in the lattice structure. The device further comprises a p-channel device formed in the n-well.

DETAILED DESCRIPTION OF THE PREFERRED EMBODIMENTS

Figure 1:
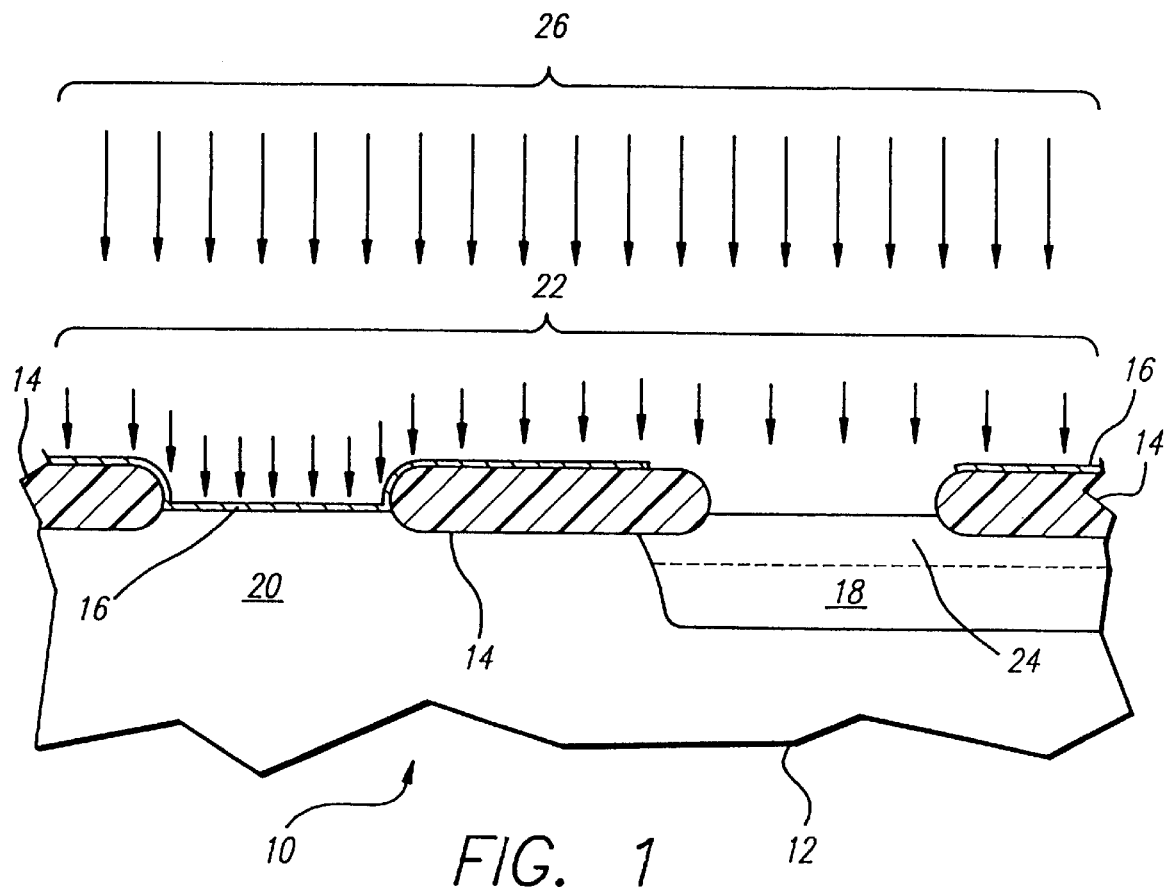
FIG. 1 is an illustration of a CMOS device having its retrograde well being fabricated.

FIG. 1 shows a CMOS device 10 under fabrication. The CMOS device 10 includes a substrate 12 having a <100> crystal axis orientation. A p-type substrate 12, for example, could be lightly doped with an impurity such as boron in a concentration between $1 \times 10^{14}$ atoms/cm$^3$ and $5 \times 10^{15}$ atoms/cm$^3$, or the p-type substrate could be a heavily doped p$^+$-type substrate upon which a thin, epitaxial layer of lightly doped p-type material is grown.

Isolation islands 14 are formed on the substrate 12 by conventional techniques. For example, a pad-oxide layer is deposited on the substrate 12 and a layer of nitride is deposited on the oxide layer by chemical vapor deposition. Portions of the nitride layer 14 are etched away to expose the oxide layer at the areas where the islands are to be grown. The substrate 12 is heated to temperatures approaching 1000° C., as the exposed oxide is slowly grown into the isolation islands 14. The substrate 12 is heated until the isolation islands 14 reach a desired thickness. Isolation islands 14 for a 0.35 micron CMOS device, for example, might have thicknesses of 5500 angstroms, and they might be spaced apart by 0.4 microns. After the isolation islands 14 are grown, the nitride and underlying pad-oxide are removed from the substrate 12. Remaining between the isolation islands 14 is a bare substrate.

An n-well mask 16 is formed on the substrate 12 and patterned to expose the bare surface at the location where an n-well 18 will be formed. A p-type transistor will eventually be formed in the n-well 18. The region 20 where an n-type transistor will be formed remains covered by the mask 16. The n-well mask 16 can be formed from photoresist and patterned by a conventional technique such as photolithography.

Before an n-well implant is made, the exposed substrate 12 is cleaned of oxide, photoresist and any other matter. A dip in hydrochloric acid does the job.

A low energy n-well implant 22 is made with an n-type dopant such as phosphorus at an energy between 150 keV and 220 keV and in a dose between $5 \times 10^{12}$ phosphorus atoms/cm$^2$ and $1 \times 10^{14}$ phosphorus atoms/cm$^2$. The phosphorus is implanted directly into the bare surface of the substrate 12. Additionally, the direction of implant 22 is orthogonal to the surface of the substrate 12, which has the <100> orientation. For example, the first n-well implant 22 can be performed by implanting a dose of approximately $2.5 \times 10^{13}$ phosphorus atoms/cm$^2$ into the substrate 12 at an energy of 170 keV, 0°.

Figure 2:
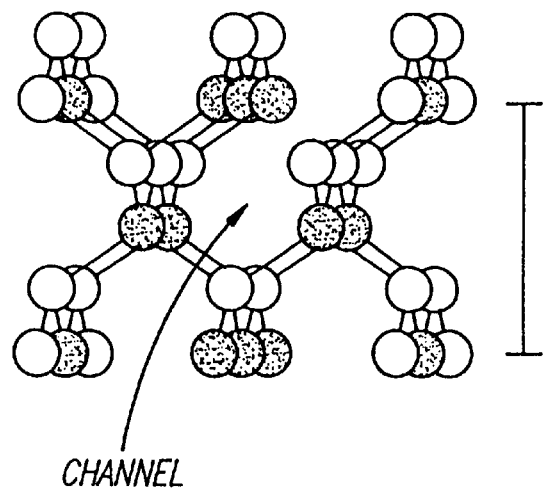
FIG. 2 is a illustration of the lattice structure of a silicon substrate and dopant atoms channeling into the substrate, the substrate forming a part of the CMOS device shown in FIG. 1.

Such an implant 22 allows the phosphorus to be implanted deeply in the substrate 12. The silicon substrate 12 has a face-centered cubic lattice structure including "channels" C between silicon atoms A (see FIG. 2). When the direction of an implant 22 is orthogonal to a substrate 12 having a <100> orientation, the direction is co-aligned with the channels C. Because the surface of the substrate 12 is bare, the phosphorus atoms are not scattered and enter deeply into the channels before hitting channel walls and lodging between the silicon atoms A. For substrate orientations other than <100>, the implant angle must be selected such that the direction of implant is co-aligned with the channels in the substrate. If the implant direction is not aligned with the channels, the phosphorus 22 will not enter deeply into the substrate 12.

Any oxide or other material on the surface of the substrate 12 will cause the phosphorus 22 to scatter and enter the channels at incident angles. As a result, the phosphorus 22 will hit the channel walls before entering deeply into the substrate 12. Thus, the surface of the substrate 12 must be cleaned of oxide and other materials prior to the n-well implant 22.

After the first low energy implant 22 is performed, a punch-through barrier 24 is formed in the n-well 18. Punch-through in a p-channel transistor occurs when the depletion region of the well-substrate junction makes contact with the source/drain-well junction. The punch-through barrier 24 prevents such contact from occurring.

The punch-through barrier 24 is formed by performing sequential ("chained") implants 26 at low energies into a shallow region of the n-well 18. The punch-through barrier 24 extends across the n-well 18. The chained implants 26 are also made into the bare substrate 12 at an implant angle of 0°. The following table lists three different sequences of implants 26.

| | Implant # | low energy n-well composition |
|---|---|---|
| I | 1 | P: $2.3 \times 10^{13}$ @ 170 keV |
| | 2 | B: $4.0 \times 10^{12}$ @ 100 keV |
| | 3 | B: $1.0 \times 10^{11}$ @ 70 keV |
| | 4 | B: $1.0 \times 10^{11}$ @ 50 keV |
| II | 1 | P: $2.5 \times 10^{13}$ @ 170 keV |
| | 2 | B: $4.0 \times 10^{12}$ @ 100 keV |
| | 3 | B: $2.2 \times 10^{11}$ @ 70 keV |
| | 4 | B: $3.0 \times 10^{11}$ @ 50 keV |
| | 5 | P: $4.0 \times 10^{11}$ @ 120 keV |
| III | 1 | P: $2.5 \times 10^{13}$ @ 170 keV |
| | 2 | B: $4.0 \times 10^{12}$ @ 150 keV |
| | 3 | B: $5.0 \times 10^{11}$ @ 80 keV |
| | 4 | B: $9.0 \times 10^{11}$ @ 55 keV |

The sequences of boron (B) and phosphorus (P), as well as the doses and implant energies, are merely exemplary. For each group of chained implants 26, the actual sequence, doses and energies would depend upon the desired characteristics of the punch-through barrier 24.

An advantage to the chained implants 26 of groups I and III is that the species needs to be changed only once; after the species is changed from phosphorus to boron, only the dose and implant energies of the boron are changed. In contrast, the chained implants 26 of group II require a species change from phosphorus to boron (after the first implant) and back to phosphorus (after the fourth implant).

Figure 3:
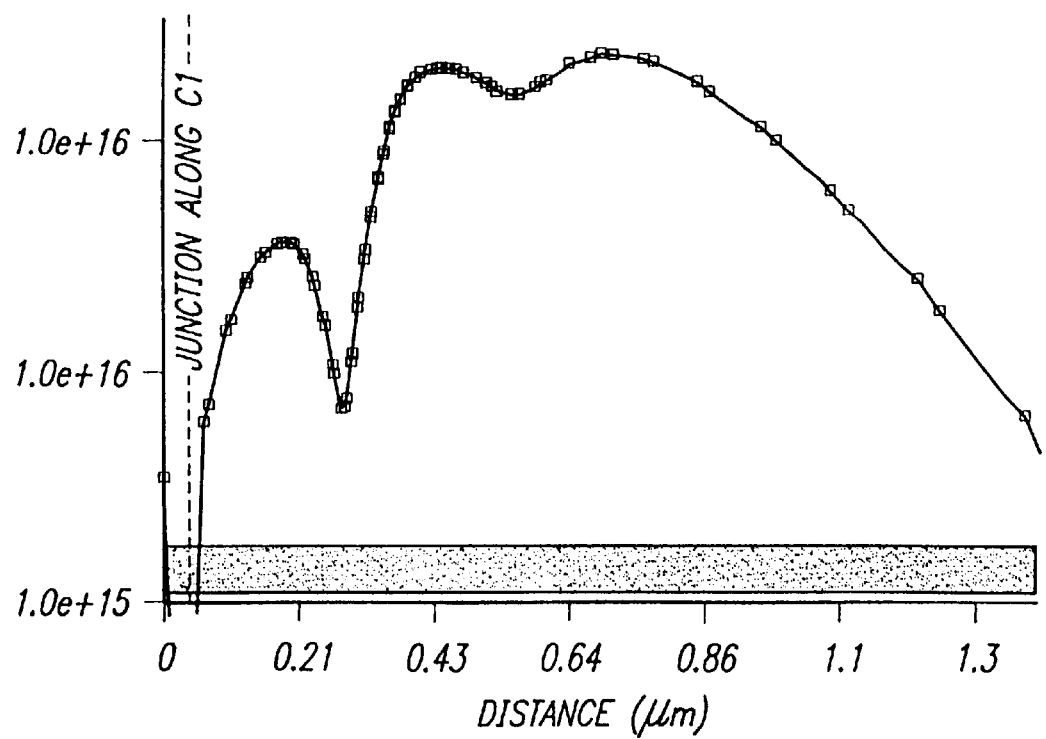
FIG. 3 is a first doping profile for the retrograde well of the CMOS vice shown in FIG. 1.
Figure 4:
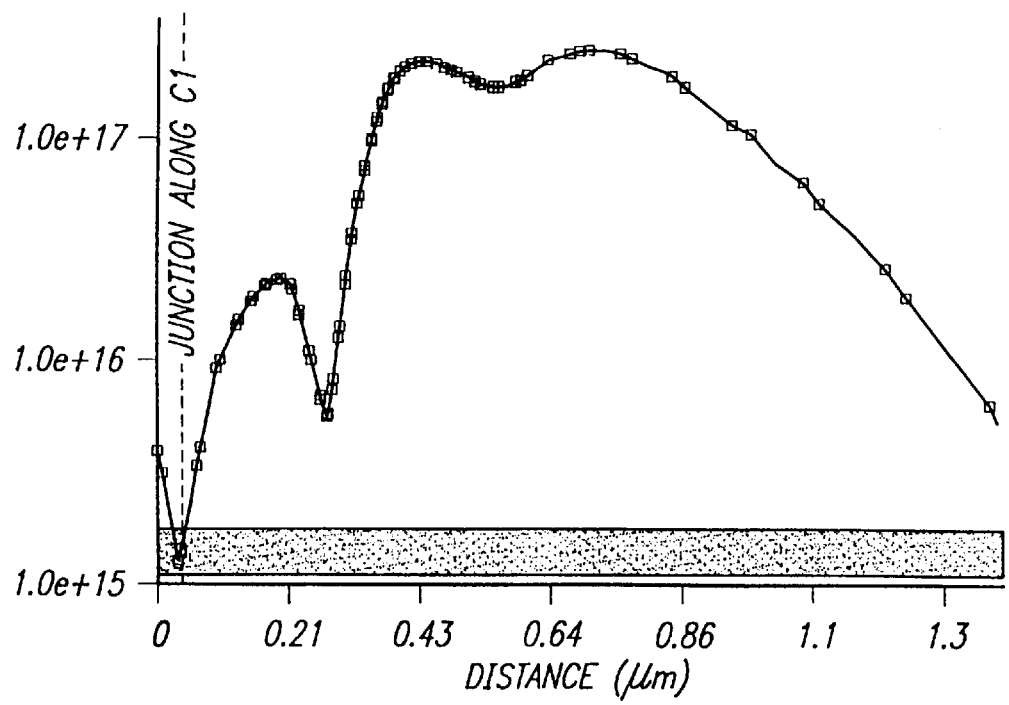
FIG. 4 is a second doping profile for the retrograde well of the CM device shown in FIG. 1.
Figure 5:
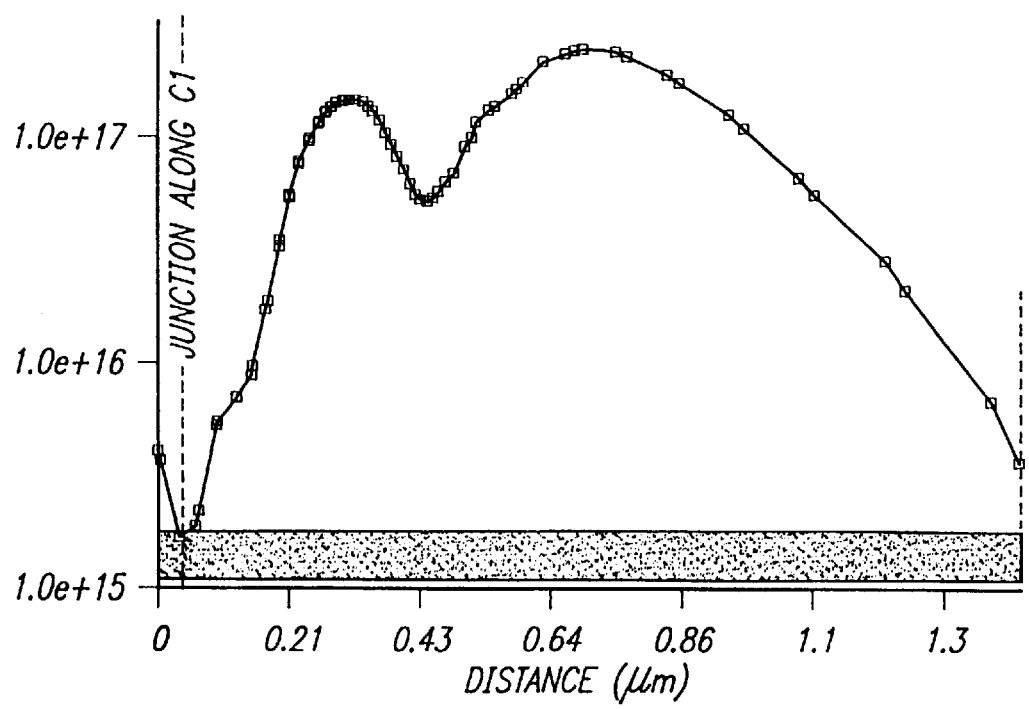
FIG. 5 is a third doping profile for the retrograde well of the CMOS device shown in FIG. 1.

FIG. 3 shows a doping profile for an n-well 18 resulting from the n-well implant 22 and the chained implants 26 of group I. Doses are represented in atoms/cm$^2$, and distance is taken from the surface of the substrate 12. FIGS. 4 and 5 show doping profiles for n-wells 18 resulting from the n-well implants 22 and the chained implants 26 of groups II and III.

Figure 6:
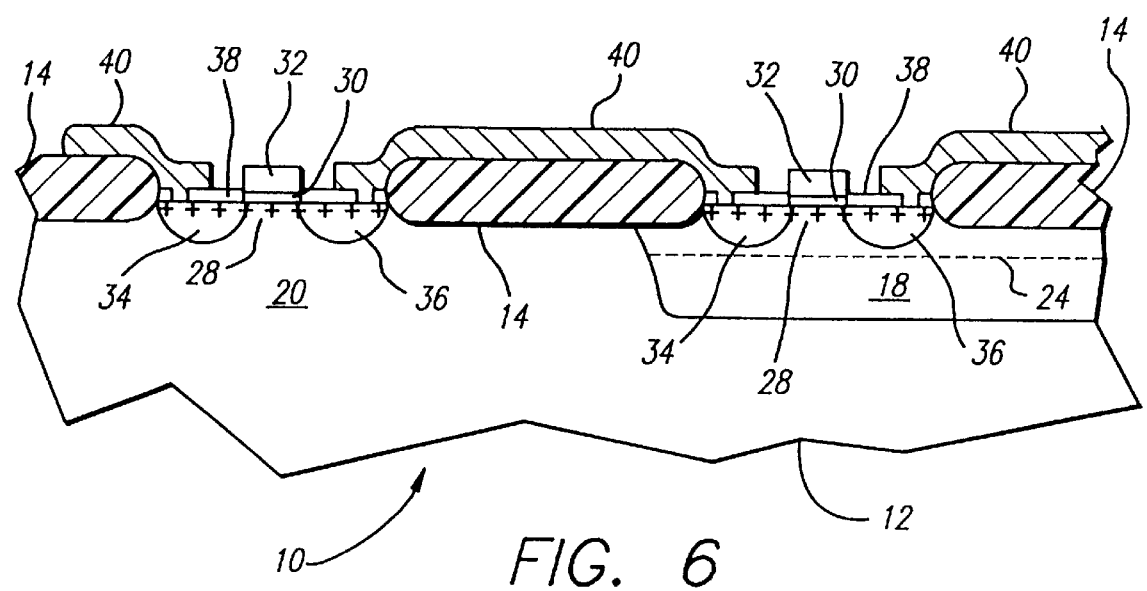
FIG. 6 is an illustration of the CMOS device after fabrication.

Reference is now made to FIG. 6. After the last of the chained implants 26 is performed, the region 20 for the n-type transistor is formed. The n-well mask 16 is stripped and a low-energy blanket implant of a p-type dopant such as boron is performed. For example, a blanket implant of approximately $6.8 \times 10^{12}$ boron atoms/cm$^2$ at 180 keV is made into the substrate 12.

Following the blanket implant, the substrate 12 is annealed to allow the implanted dopants to diffuse to the desired depths. For example, the substrate 12 is annealed at approximately 900° C. in a neutral ambient such as nitrogen for approximately 30 minutes. This allows the n-well 18, the p-transistor region 20 and the punch-through barrier 24 to be activated at the same time.

After annealing, a threshold adjust implant of boron 28 is performed. A sacrificial oxide layer is grown to a thickness ranging between 200 and 500 angstroms (preferably 300 angstroms). For example, a 300 angstrom layer of silicon dioxide is grown by heating the substrate 12 in a steam ambient at 900° C. for approximately 30 minutes. The sacrificial oxide protects the substrate from contamination and keeps the boron implant(s) at a shallow depth. One or two implants of boron 28 just below the surface of the substrate 12 can provide a correct adjustment of the threshold voltages for both the n-channel and the p-channel transistors. For example, the boron 28 is implanted through the sacrificial gate oxide in doses between $1 \times 10^{12}$ and $1 \times 10^{13}$ atoms/cm$^2$. A single implant can be performed at implant energies between 50 and 100 keV. If two implants are performed to adjust the threshold voltage, the two implants can be performed at lower implant energies. For example, a first implant of boron 28 can be performed at 25 keV and a second implant of boron 28 can be performed at 30 keV.

After the threshold voltage is adjusted, the sacrificial oxide layer is stripped and a gate structure is formed. A SiO$_2$ gate oxide is grown, and a layer of polysilicon is deposited on the gate oxide. The polysilicon layer is masked and etched into a gate 32, and an n+-type dopant such as phosphorus is implanted into the gate 32.

Next, the source and drain regions 34 and 36 are formed for the n-channel devices. An n-source/drain mask is formed on the wafer, exposing the p-wells at locations where the sources and drains of the n-channel transistors are to be formed. An n-type dopant is implanted into the p-wells, and an anneal is performed to activate the n-dopant. The n-source/drain mask is stripped, and a p-source/drain mask is formed on the wafer, exposing the n-wells at locations where the sources and drains of the p-channel transistors are to be formed. A p-type dopant is implanted into the n-wells, and an anneal is performed to activate the p-dopant.

If the CMOS device is a short channel device, lightly doped drain (LDD) regions are formed to mitigate the effects of hot carriers. The LDD regions can be formed before or after the more heavily doped drain and source regions 34 and 36 are formed.

A doped oxide layer 38 is deposited over the source and drain regions 32 and 34, and contact openings are opened in the oxide layer 38 to expose the source and drain regions 34 and 36. A first level of metal contacts 40 is formed by depositing a refractory metal layer over the substrate such that the contact openings are filled with the metal. A mask is laid over the metal and the metal layer is patterned. An anneal is performed to diffuse the metal into the drain and source regions 34 and 36 (for shallow junction devices, a diffusion barrier is formed between the metal and the source/drain regions 32 and 34). For each additional level of metalization, an intermetal dielectric is deposited on the underlying layer, a metal layer is deposited on the intermetal dielectric, and the metal layer is patterned into contacts 40.

A passivation layer (not shown) is formed over the last level of metal contacts 40. The passivation layer protects the CMOS device 10 from moisture, contaminants and scratching. Bonding pads (not shown) are created in the upper periphery of each die, which allows the die to be connected to a mechanical package.

Figure 7:
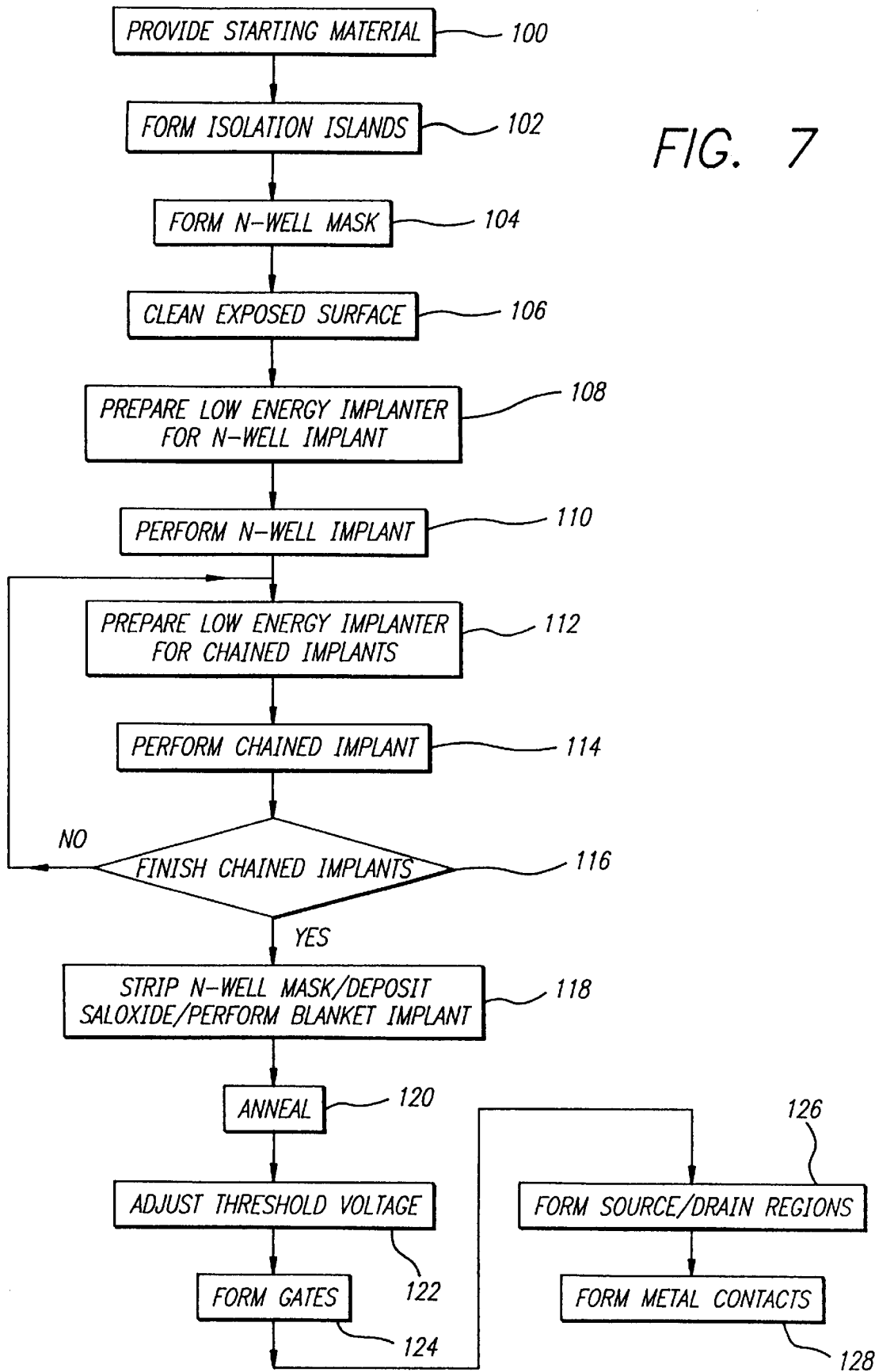
FIG. 7 is a flowchart of a method of fabricating the CMOS device shown in FIG. 6.

The steps for fabricating the device 10 are summarized in FIG. 7. In accordance with VLSI technology, many CMOS devices are fabricated simultaneously on a wafer. Thus, a doped wafer is provided as starting material for the CMOS devices (step 100). Isolation islands 14 for each device are formed on the wafer (step 102) and an n-well mask 16 is formed on the wafer (step 104). Exposed through the n-well mask are the regions where the n-wells 18 will be formed. The exposed surface of the wafer is cleaned of oxide (step 106). Next, a low energy implanter is prepared for performing an implant 22 of phosphorus into the wafer (step 108). The phosphorus is implanted into the bare surface at an angle that allows the phosphorus to channel deeply into the wafer (step 110).

After the n-well implant 22 is performed, a punch-through barrier 24 is formed. The low energy implanter is set up for the chained implants 26 (step 112). The implant energy, but not the species or the implant angle, is changed for the first chained implant 26, and the first implant of the chain is performed into the exposed, bare surface of the wafer (step 114). The low energy implanter is then prepared for the remaining implants in the chain (step 116). The species is changed from phosphorus to boron, and the boron is implanted into the bare surface of the wafer. For each remaining implant, the species is not changed; only the implant energies are changed (unless a group II chain is performed, in which case the last implant requires the species to be changed once again to phosphorus).

After the chained implants 26 have been performed, the n-well mask 16 is stripped, an oxide layer is deposited on the wafer, and a blanket implant of boron is performed to dope the regions 20 for the p-channel transistors (step 118).

Then, the wafer is annealed (step 120). The n-wells 18, the regions 20 for the p-channel transistors and the punch-through barriers 24 are activated at the same time.

A threshold voltage adjustment follows (step 122). A sacrificial layer of oxide is deposited on the wafer, and boron is implanted through the sacrificial oxide to depths just below the surface of the wafer.

The sacrificial oxide is removed and gate structures are formed over the n-wells 18 and p-doped regions 20 (step 124). Source and drain regions 34 and 36 are then formed, first in the p-doped regions 20, then in the n-wells 18 (step 126). At least one level of metal contacts 40 is formed over the source and drain regions 34 and 36 (step 128).

Figure 8:
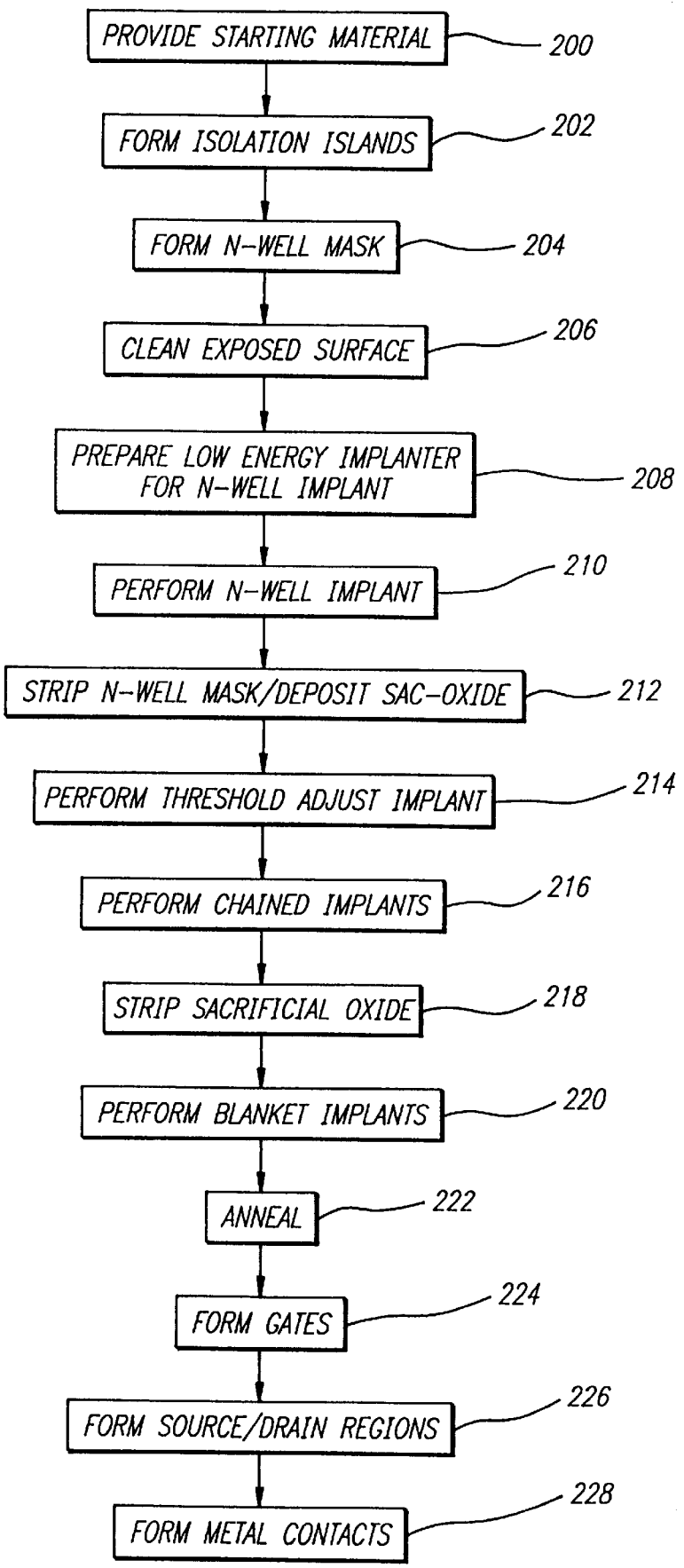
FIG. 8 is a flowchart of an alternative method of fabricating the CMOS device shown in FIG. 6.

FIG. 8 shows a different method of fabricating the CMOS device 10. Steps 200–210, leading up to and including the n-well implant 22, are performed in the same manner as the steps 100–110 described above. After the n-well implant 22 is performed, however, the threshold voltage is adjusted. Therefore, after the first n-well implant 22 is made directly into the bare wafer, the n-well mask 16 is stripped, a sacrificial oxide layer is deposited on the wafer (step 212), and the boron is implanted at a dose and energy that are sufficient to adjust the threshold voltages of both the p-channel and n-channel transistors (step 214). The chained implants are then performed through the sacrificial oxide (step 216). After the last chained implant is performed, the sacrificial oxide is stripped (step 218), the p-doped regions 20 are formed by blanket implants (step 220), and the wafer is annealed to activate the n-wells 18, the p-doped regions 20 and the punch-through barriers 24 (step 222). Gate structures are added (step 224), followed by source and drain regions 34 and 36 (step 226) and metal contacts 40 (step 228).

One advantage of performing the threshold voltage adjustment before the chained implants 26 is that time can be saved in setting up the implanter. After the threshold voltage is adjusted, only the species has to be changed (from boron to phosphorus).

The above-methods describe the formation of punch-through barriers 24 for preventing punch-through from occurring. However, the CMOS device 10 does not require a punch-through barrier 24 to be formed. If measures against punch-through are to be taken, pocket implants can be performed. The pocket implants are performed at high angles to create pocket distributions that protect the drain and source regions 34 and 36. However, the pocket implants require additional masking and other steps to be performed, typically during the formation of the drain and source regions 34 and 36. Moreover, the punch-through barrier 24 gives better control than do the pocket implants, and the punch-through barrier 24 can be activated at the same time as the n-wells 18.

The methods above can be easily adapted to make deep p-type implants and create doping profiles having high concentrations of p-type dopants deep in the substrate. In forming such a profile for a p-well of a CMOS device, for example, the blanket implant would be replaced by an extra masking step (a p-well mask for exposing regions where p-wells are to be formed) and an implant of a p-type dopant such as boron at a 0° angle. Energy and dose of the p-well implant would be selected to place a specific concentration of boron at a desired depth.

Thus disclosed are methods of performing deep implants at low implant energies. The methods eliminate the need for expensive, high energy implanters to perform the deep implants.

The methods can be used for forming retrograde n-wells in CMOS devices, deep concentrations in p-wells and, for that matter, any type of doping profile in a semiconductor substrate.

When applied to the fabrication of CMOS devices, the methods offer the additional advantages of allowing the punch-through barriers to be activated at the same time as the retrograde wells. The method also eliminates the need for high angle punch-through implants and the accompanying four wafer rotations that are presently required to form the punch-through barrier. This reduces fabrication time and cost.

Fabrication time and cost are further reduced because the n-well and chained implants are performed in a sequence. The sequential implants do not require additional masking steps. Although extra time is required to set up the implanter for chained implants, overall fabrication time is reduced since the masking steps are eliminated.

The method is robust in creating well-behaved p-channel devices having stable threshold voltages. Also, the p-channel devices exhibit a reduced leak-through current.

It is understood that various changes and modifications may be made without departing from the spirit and scope of the invention. The methods and device above are not limited to the materials described herein. For example, the substrate can be germanium or gallium arsenide, the background doping of the substrate can be p-type or n-type. Moreover, the methods and device are not limited to the doses, implant energies and implant angles described above. Rather, the doses, implant energies and implant angles are device-dependent, varying upon the desired operational specifications of the device. Finally, the method is not limited to the fabrication steps (e.g., depositing, masking, patterning) described above or to the exact order in which they are described. A wide variety of semiconductor fabrication techniques are available. Accordingly, the present invention is not limited to the precise embodiments described hereinabove. Instead, it is defined by the claims that follow.

We claim:

1. A method of fabricating a CMOS device having a pair of n-channel and p-channel transistors, comprising the steps of:

forming isolation islands in a substrate;

doping a first region for the p-channel transistor, the first region being doped by cleaning a surface of the substrate at a location where the p-channel transistor is formed, and implanting an n-type dopant directly into the cleaned surface of the substrate at a low energy in a direction that is co-aligned with channels formed within the lattice structure of the substrate;

doping a second region for the n-channel transistor by performing a blanket implant of a p-type dopant;

annealing the substrate;

forming gate structures over the first and second regions;

forming drain and source regions in the first and second regions; and forming contacts for the source and drain regions.

2. The method of claim 1, wherein the first region is a retrograde n-well, and wherein the method further comprises the step of performing chained implants into the n-well to create a punch-through barrier, whereby the punch-through barrier is activated along with the n-well during the annealing step.

3. The method of claim 2, wherein the chained implants are also made into the cleaned surface of the substrate.

4. The method of claim 2, further comprising the step of performing a threshold voltage adjustment after the n-well implant but before the chained implants, the threshold voltage adjustment being performed by forming an oxide layer over the substrate and implanting a p-type dopant through the oxide and into a shallow region of the substrate, wherein the chained implants are performed through the oxide layer.

5. The method of claim 2, further comprising the step of performing a threshold voltage adjustment after the chained implants have been performed.

6. The method of claim 1, wherein the substrate has an <100> orientation and wherein the n-type dopant is implanted into the first region in a direction that is orthogonal to the surface of the substrate.

7. The method of claim 1, wherein the n-type dopant is implanted in a dose between $5 \times 10^{12}$ phosphorus atoms/cm$^2$ and $1 \times 10^{14}$ phosphorus atoms/cm$^2$.

8. The method of claim 1, wherein the implant of n-type dopant is performed at an energy below 220 keV.

9. A method of fabricating a plurality of CMOS devices on a semiconductor wafer, the wafer having a <100> orientation, the method comprising the steps of:

forming isolation islands in the wafer;

forming an n-well mask on a surface of the wafer, the surface being exposed through the mask at locations where n-wells are formed;

cleaning the exposed surface of the wafer;

directing an n-type dopant towards the wafer at an energy between 150 keV and 220 keV in a direction that is orthogonal to the surface of the wafer, whereby the n-type dopant is implanted deeply below the surface of the wafer;

stripping the n-well mask;

performing a blanket implant of a p-type dopant;

annealing the wafer;

forming gate structures on the wafer;

forming drain and source regions in the wafer; and forming contacts for the source and drain regions.

10. The method of claim 9, further comprising the step of performing chained implants into the n-wells to create punch-through barriers, whereby the punch-through barriers are activated along with the n-wells during the annealing step.

11. The method of claim 10, wherein the chained implants are also made into the cleaned surface of the substrate.

12. The method of claim 10, further comprising the step of performing a threshold voltage adjustment after the n-well implant but before the chained implants, the threshold voltage adjustment being performed by forming an oxide layer over the n-well and implanting a p-type dopant through the oxide and into a shallow region of the substrate, wherein the chained implants are performed through the oxide layer.

13. The method of claim 10, further comprising the step of performing a threshold voltage adjustment after the chained implants have been performed.

14. The method of claim 9, wherein the n-type dopant is implanted in a dose between $5\times10^2$ phosphorus atoms/cm$^2$ and $1\times10^{14}$ phosphorus atoms/cm$_2$.

* * * * *